United States Patent
Alshinnawi et al.

(10) Patent No.: US 9,164,805 B2
(45) Date of Patent: Oct. 20, 2015

(54) MANAGING WORKLOAD DISTRIBUTION TO REDUCE ACOUSTIC LEVELS

(71) Applicant: International Business Machines Corporation, Armonk, NY (US)

(72) Inventors: Shareef F. Alshinnawi, Durham, NC (US); Gary D. Cudak, Creedmoor, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 209 days.

(21) Appl. No.: 14/080,372

(22) Filed: Nov. 14, 2013

(65) Prior Publication Data

US 2015/0134825 A1    May 14, 2015

(51) Int. Cl.
| | | |
|---|---|---|
| G06F 9/50 | (2006.01) | |
| H04L 12/911 | (2013.01) | |
| G06F 1/32 | (2006.01) | |
| H05K 7/20 | (2006.01) | |

(52) U.S. Cl.
CPC .............. *G06F 9/5027* (2013.01); *H04L 47/70* (2013.01); *G06F 1/3206* (2013.01); *G10K 2210/3039* (2013.01); *H05K 7/20709* (2013.01)

(58) Field of Classification Search
CPC ........... G10K 11/16; G10K 2210/3039; G06F 11/32; G06F 9/5027; G06F 1/3206; H04L 47/70; H05K 7/20709
See application file for complete search history.

(56) References Cited

U.S. PATENT DOCUMENTS

| | | | | |
|---|---|---|---|---|
| 4,665,549 A | * | 5/1987 | Eriksson et al. | 381/71.5 |
| 6,141,213 A | * | 10/2000 | Antonuccio et al. | 361/679.48 |
| 6,816,372 B2 | * | 11/2004 | Huettner et al. | 361/695 |
| 6,836,849 B2 | * | 12/2004 | Brock et al. | 713/310 |

(Continued)

FOREIGN PATENT DOCUMENTS

| EP | 2172887 A3 | 4/2010 |
|---|---|---|
| WO | WO 2007099541 A3 * | 4/2009 |

OTHER PUBLICATIONS

Chen, Doron, et al. "Leveraging disk drive acoustic modes for power management." Mass Storage Systems and Technologies (MSST), 2010 IEEE 26th Symposium on. IEEE, 2010.*

(Continued)

*Primary Examiner* — Jimmy H Tran
(74) *Attorney, Agent, or Firm* — Katherine S. Brown; Jeffrey L. Streets

(57) ABSTRACT

A computer-implemented method obtains a correlation between percent utilization and noise level for a plurality of compute node types, and obtains an inventory of a plurality of compute nodes in a cluster, wherein the inventory identifies each compute node by a compute node type, and wherein the plurality of compute nodes includes two or more compute node types. The method further includes determining a percent utilization of each compute node, and, for each compute node of an identified compute node type, determining a noise level using the determined percent utilization for the compute node as input into the correlation between percent utilization and noise level for the identified compute node type. An overall noise level in the cluster is calculated using the noise level determined for each compute node, and workload is distributed among the plurality of compute nodes to reduce the calculated overall noise level in the cluster.

20 Claims, 8 Drawing Sheets

(56) References Cited

U.S. PATENT DOCUMENTS

| | | | |
|---|---|---|---|
| 7,139,401 B2* | 11/2006 | Culman et al. | 381/71.7 |
| 7,215,541 B2 | 5/2007 | Nelson | |
| 7,283,359 B2 | 10/2007 | Bartell et al. | |
| 7,317,801 B1* | 1/2008 | Amir | 381/71.1 |
| 7,331,532 B2 | 2/2008 | Currie et al. | |
| 7,383,382 B2 | 6/2008 | Powell et al. | |
| 7,500,911 B2* | 3/2009 | Johnson et al. | 454/184 |
| 7,716,006 B2 | 5/2010 | Coskun et al. | |
| 7,779,960 B2* | 8/2010 | Tang et al. | 181/225 |
| 7,788,670 B2* | 8/2010 | Bodas et al. | 718/105 |
| 7,869,607 B2* | 1/2011 | Barath et al. | 381/71.3 |
| 7,986,526 B1* | 7/2011 | Howard et al. | 361/694 |
| 8,072,704 B1 | 12/2011 | Goldberg et al. | |
| 8,113,012 B2* | 2/2012 | Hoeft et al. | 62/407 |
| 8,165,311 B2* | 4/2012 | Rodrigues et al. | 381/71.5 |
| 8,292,593 B2* | 10/2012 | Orr et al. | 417/2 |
| 8,346,398 B2* | 1/2013 | Ahmed et al. | 700/278 |
| 8,515,095 B2* | 8/2013 | Bard | G06F 1/206 381/94.1 |
| 8,566,626 B2* | 10/2013 | Dutton et al. | 713/320 |
| 8,726,053 B2* | 5/2014 | Dutton et al. | 713/320 |
| 8,737,634 B2* | 5/2014 | Brown | G10K 11/1788 381/56 |
| 8,855,329 B2* | 10/2014 | Slapak et al. | 381/71.3 |
| 8,886,985 B2* | 11/2014 | Somasundaram et al. | 713/340 |
| 2002/0133728 A1* | 9/2002 | Agarwal | 713/324 |
| 2002/0154481 A1* | 10/2002 | Wagner | 361/694 |
| 2003/0123675 A1* | 7/2003 | Culman et al. | 381/71.1 |
| 2004/0120113 A1* | 6/2004 | Rapaich | G06F 1/206 361/679.46 |
| 2005/0170770 A1* | 8/2005 | Johnson et al. | 454/184 |
| 2005/0237717 A1* | 10/2005 | Babb et al. | 361/697 |
| 2005/0273321 A1* | 12/2005 | Choi | 704/207 |
| 2007/0230114 A1 | 10/2007 | Bartell et al. | |
| 2007/0293137 A1* | 12/2007 | Crippen et al. | 454/184 |
| 2008/0106864 A1 | 5/2008 | Merino | |
| 2009/0092261 A1* | 4/2009 | Bard | G06F 1/206 381/71.1 |
| 2010/0056036 A1* | 3/2010 | Nobile | 454/184 |
| 2010/0079094 A1* | 4/2010 | Beltman et al. | 318/460 |
| 2011/0040568 A1* | 2/2011 | Dutton et al. | 705/1.1 |
| 2013/0024710 A1 | 1/2013 | Jackson | |
| 2014/0359323 A1* | 12/2014 | Fullerton et al. | 713/320 |

OTHER PUBLICATIONS

Crippen, Martin J., et al. "BladeCenter packaging, power, and cooling." IBM journal of research and development 49.6 (2005): 887-904.*

Barroso, Luiz André, and Urs Hölzle. "The case for energy-proportional computing." Computer 12 (2007): 33-37.*

Wang, Xiaorui, and Ming Chen. "Cluster-level feedback power control for performance optimization." High Performance Computer Architecture, 2008. HPCA 2008. IEEE 14th International Symposium on. IEEE, 2008.*

Dasgupta, Gargi, et al. "Workload management for power efficiency in virtualized data centers." Communications of the ACM 54.7 (2011): 131-141.*

Cabric, Danijela, Artem Tkachenko, and Robert W. Brodersen. "Experimental study of spectrum sensing based on energy detection and network cooperation." Proceedings of the first international workshop on Technology and policy for accessing spectrum. ACM, 2006.*

Wang et al., "Thermal aware workload placement with task-temperature profiles in a data center", J Supercomput, Springer Science+Business Media, LLC 2011, Jun. 7, 2011, 24 pages.

Moore et al., "Making Scheduling "Cool": Temperature-AwareWorkload Placement in Data Centers", Department of Computer Science Duke University, Internet Systems and Storage Lab Hewlett Packard Labs, USENIX Association 2005 USENIX Annual Technical Conference, Jan. 4, 2005, pp. 62-74.

Chen et al., "Disk Storage Power Management", IBM Research Report, H0283 (H1005-008) May 15, 2010, Computer Science, IBM Research Division Haifa Research Laboratory, Haifa, Israel, 5 pages.

* cited by examiner

MANAGING WORKLOAD DISTRIBUTION TO REDUCE ACOUSTIC LEVELS

BACKGROUND

1. Field of the Invention

The present invention relates to the management of virtual machines and workload management in a virtual machine environment.

2. Background of the Related Art

In a cloud computing environment, a user is assigned a virtual machine somewhere in the computing cloud. The virtual machine provides the software operating system and has access to physical resources, such as input/output bandwidth, processing power and memory capacity, to support the user's application. Provisioning software manages and allocates virtual machines among the available computer nodes in the cloud. Because each virtual machine runs independent of other virtual machines, multiple operating system environments can co-exist on the same computer in complete isolation from each other.

BRIEF SUMMARY

One embodiment of the present invention provides a computer-implemented method, comprising obtaining a correlation between percent utilization and noise level for each of a plurality of compute node types, and obtaining an inventory of a plurality of compute nodes in a cluster, wherein the inventory identifies each of the compute nodes by a compute node type, and wherein the plurality of compute nodes includes two or more compute node types. The method further comprises determining a percent utilization of each of the compute nodes, and, for each compute node of an identified compute node type, determining a noise level using the determined percent utilization for the compute node as input into the correlation between percent utilization and noise level for the identified compute node type. An overall noise level for the entire cluster of compute nodes is calculated as a function of the noise level determined for each compute node, and workload is then distributed among the plurality of compute nodes to reduce the calculated overall noise level for the entire cluster of compute nodes.

Another embodiment of the present invention provides a computer program product including computer usable program code embodied on a non-transitory computer readable storage medium. The computer program product includes computer usable program code for obtaining a correlation between percent utilization and noise level for each of a plurality of compute node types, and computer usable program code for obtaining an inventory of a plurality of compute nodes in a cluster, wherein the inventory identifies each of the compute nodes by a compute node type, and wherein the plurality of compute nodes includes two or more compute node types. The computer program product further includes computer usable program code for determining a percent utilization of each of the compute nodes, and computer usable program code for determining, for each compute node of an identified compute node type, a noise level using the determined percent utilization for the compute node as input into the correlation between percent utilization and noise level for the identified compute node type. Still further, the computer program product includes computer usable program code for calculating an overall noise level for the entire configuration as a function of the noise level determined for each compute node, and computer usable program code for distributing workload among the plurality of compute nodes to reduce the calculated overall noise level for the entire configuration.

DETAILED DESCRIPTION

Figure 1:
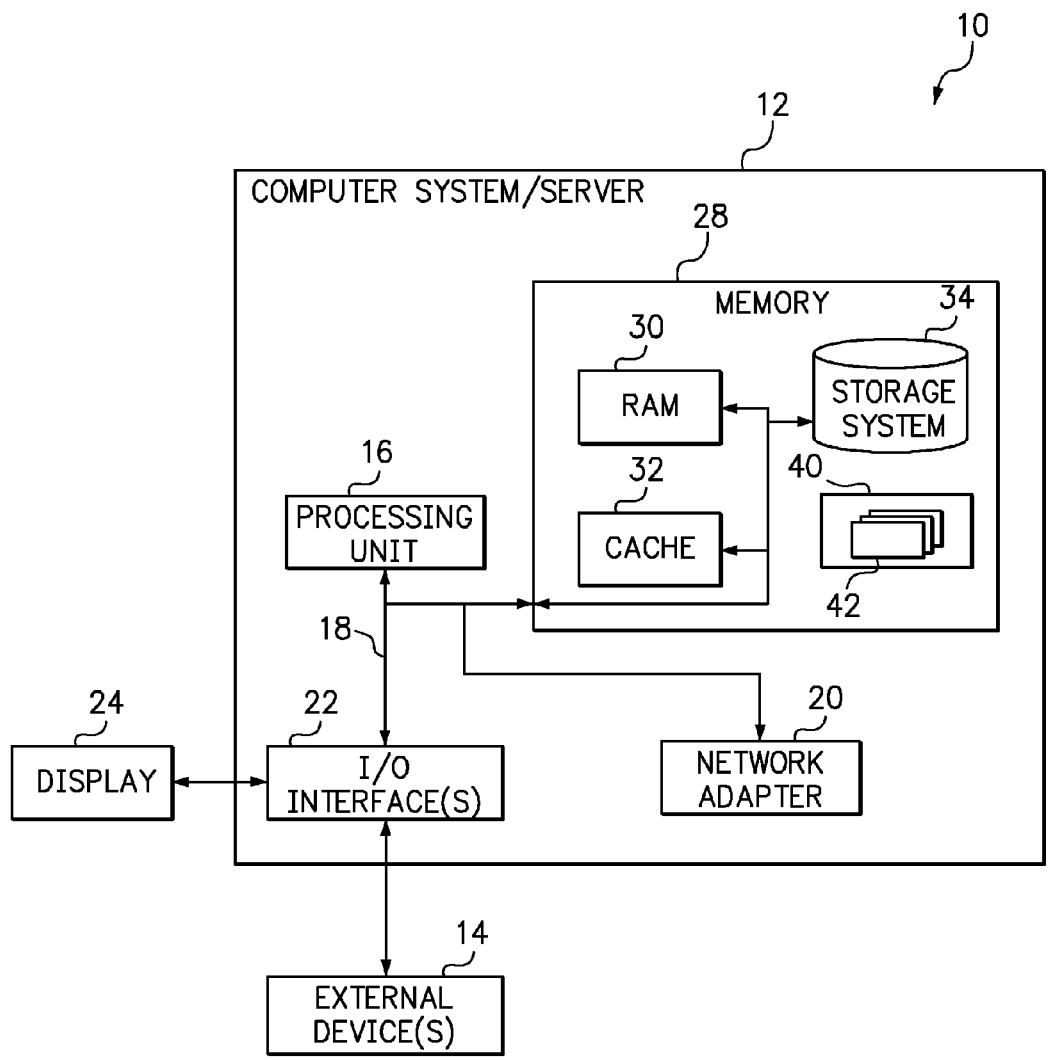
FIG. 1 depicts an exemplary computer that may be utilized by the presently disclosed method, system, and/or computer program product.

One embodiment of the present invention provides a computer-implemented method, comprising obtaining a correlation between percent utilization and noise level for each of a plurality of compute node types, and obtaining an inventory of a plurality of compute nodes in a cluster, wherein the inventory identifies each of the compute nodes by a compute node type, and wherein the plurality of compute nodes includes two or more compute node types. The method further comprises determining a percent utilization of each of the compute nodes, and, for each compute node of an identified compute node type, determining a noise level using the determined percent utilization for the compute node as input into the correlation between percent utilization and noise level for the identified compute node type. An overall noise level for the entire configuration is calculated as a function of the noise level determined for each compute node, and workload is distributed among the plurality of compute nodes to reduce the calculated overall noise level for the entire configuration.

A cluster may include a variety of compute nodes, network switches and data storage entities in various configurations to accomplish a task or establish a desired performance or capacity. Embodiments of the present invention are not limited to any particular cluster configuration, the types of compute nodes and supporting devices within the cluster, or the size of the cluster. Optionally, a management entity, such as the Extreme Cloud Administration tool (xCAT) management entity, obtains the inventory of the plurality of compute nodes in the cluster, and a workload management application or "workload manager" running on the management entity distributes workload among the plurality of compute nodes to reduce the calculated overall noise level.

Cluster configurations can generate quite a lot of noise, primarily due to the operating level of cooling fans. Accordingly, servers, blade servers, PureFlex systems and interconnect switches, for example, generate different amounts of noise based on the varying degrees of utilization. The present invention uses acoustic modeling to predict how the distribution of workload will affect the overall noise produced by a cluster, and then distribute the workload to manage the overall noise level.

For example, the workload manager may detect that a BladeCenter blade server has a current utilization of 60% and can calculate that that increasing the system utilization of that blade server to 80% as a result of provisioning or migrating a new job or application to the blade server will cause more noise to be generated than executing the same new job or application on a x3850 m4 server with the same current utilization of 60%. In this scenario, the new job would be scheduled to run on the x3850 m4. Extrapolating this novel concept to the entire cluster, jobs or applications may be distributed in various manners in order to reduce or minimize the overall noise generated by the cluster.

In a further embodiment, a correlation between percent utilization and noise level for each of a plurality of compute node types may be obtained by accessing empirical data storing a noise level measured at various percentages of utilization for a compute node of each compute node type. For example, the empirical data storing a noise level measured at various percent utilization of a compute node may be collected by using an acoustic sensor to measure the noise level generated by the compute node as the percent utilization of the compute node is varied in an acoustically isolated test environment, such as a computer laboratory. Alternatively, the empirical data storing a noise level measured at various percent utilization of a compute node may be obtained by a compute node within the cluster using an acoustic sensor to measure the noise level as the percent utilization is varied during actual performance of a job.

In an optional configuration, the plurality of compute node types may include a first compute node type having a processor, a hard drive, and a power supply. Therefore, the correlation between percent utilization and noise level for the first compute node type may include a correlation between noise level and a percent utilization of the processor, a percent utilization of the hard drive, and a percent utilization of the power supply. Such a correlation may include three separate utilization/noise correlations or an overall correlation of noise for any given combination of processor utilization, hard drive utilization and power supply utilization. It should be recognized that a compute node may have any number of noise-generating components that could be included in such a utilization/noise correlation.

Another embodiment assumes that the noise from each compute node is non-coherent. Therefore, the overall noise level generated by all of the compute nodes may be calculated by the following equation:

$$10 \cdot \log_{10}\left(\frac{p_1^2 + p_2^2 + \ldots + p_n^2}{p_0^2}\right)$$

wherein:
n is the number of compute nodes in the cluster;
$p_i$ is the noise level produced by compute node i,
where i is an integer number from 1 to n; and
$p_0$ is the sound pressure of 20 microPascals (μPa).

Distributing workload among the plurality of compute nodes to reduce the calculated overall noise level may be accomplished in various manners. In a first example, workload may be distributed among the plurality of compute nodes to minimize the calculated overall noise level. In a second example, a job may be migrated from a first compute node in the cluster to a second compute node in the cluster in response to determining that migrating the job from the first compute node to the second compute node will reduce the noise produced by the first compute node more than increase the noise produced by the second compute node. This approach would involve migrating jobs until no more migrations would result in lower overall noise. In a third example, a job may be migrated from a first compute node in the cluster to a second compute node in the cluster in response to determining that migrating the job from the first compute node to the second computer node will reduce the overall noise level more than migrating another job between any other combination of compute nodes. This approach would migrate a job only if that migration provided the greatest noise reduction.

A fourth example of distributing workload among the plurality of compute nodes to reduce the calculated overall noise level, may include provisioning a new job to a target compute node in the cluster, wherein the target compute node is selected from among the plurality of compute nodes in the cluster as being able to run the new job with a smaller increase in the overall noise level than any of the other compute nodes in the cluster. The provisioning of additional workload is expected to increase the overall noise level, but the new job is provisioned to a compute node that will add the least amount of noise, given the compute node's current percent utilization and the percent utilization of the compute node after receiving the new job.

A fifth example of distributing workload among the plurality of compute nodes to reduce the calculated overall noise level, may include booting an additional compute node in the cluster and migrating a job from a first compute node in the cluster to the additional compute node in response to determining that booting the additional compute node and migrating the job from the first compute node to the additional compute node will reduce the overall noise level. Alternatively, the additional compute node may be booted to receive provisioning of a new job.

In yet another embodiment, a correlation between percent utilization and noise level may be obtained for each of a plurality of supporting device types, such as network switches and storage devices. Such a method may include, for example, obtaining an inventory of supporting devices in the cluster, wherein the inventory identifies each of the supporting devices by a supporting device type, and determining a percent utilization of each of the supporting devices. Then, for each supporting device of an identified supporting device type, the method may determine a noise level using the determined percent utilization for the supporting device as input into the correlation between percent utilization and noise level for the identified supporting device type. The step of calculating an overall noise level as a function of the noise level determined for each compute node may then include calculating an overall noise level as a function of the noise level determined for each compute node and the noise level determined for each supporting device. In a further option, the step of distributing workload among the plurality of compute nodes to reduce the calculated overall noise level, may include migrating a job from a first compute node in the cluster to a second compute node in the cluster in response to determining that migrating the job from the first compute node to the second compute node will reduce the noise produced by the first compute node and the supporting devices used by the first compute node more than increase the noise produced by the second compute node and the supporting devices used by the second compute node.

Another embodiment of the present invention provides a computer program product including computer usable program code embodied on a non-transitory computer readable storage medium. The computer program product includes computer usable program code for obtaining a correlation between percent utilization and noise level for each of a plurality of compute node types, and computer usable program code for obtaining an inventory of a plurality of compute nodes in a cluster, wherein the inventory identifies each of the compute nodes by a compute node type, and wherein the plurality of compute nodes includes two or more compute node types. The computer program product further includes computer usable program code for determining a percent utilization of each of the compute nodes, and computer usable program code for determining, for each compute node of an identified compute node type, a noise level using the determined percent utilization for the compute node as input into the correlation between percent utilization and noise level for the identified compute node type. Still further, the computer program product includes computer usable program code for calculating an overall noise level as a function of the noise level determined for each compute node, and computer usable program code for distributing workload among the plurality of compute nodes to reduce the calculated overall noise level.

The foregoing computer program products may further include computer readable program code for implementing or initiating any one or more aspects of the methods described herein. Accordingly, a separate description of the methods will not be duplicated in the context of a computer program product.

It should be understood that although this disclosure is applicable to cloud computing, implementations of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as Follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as Follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring now to FIG. 1, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 2:
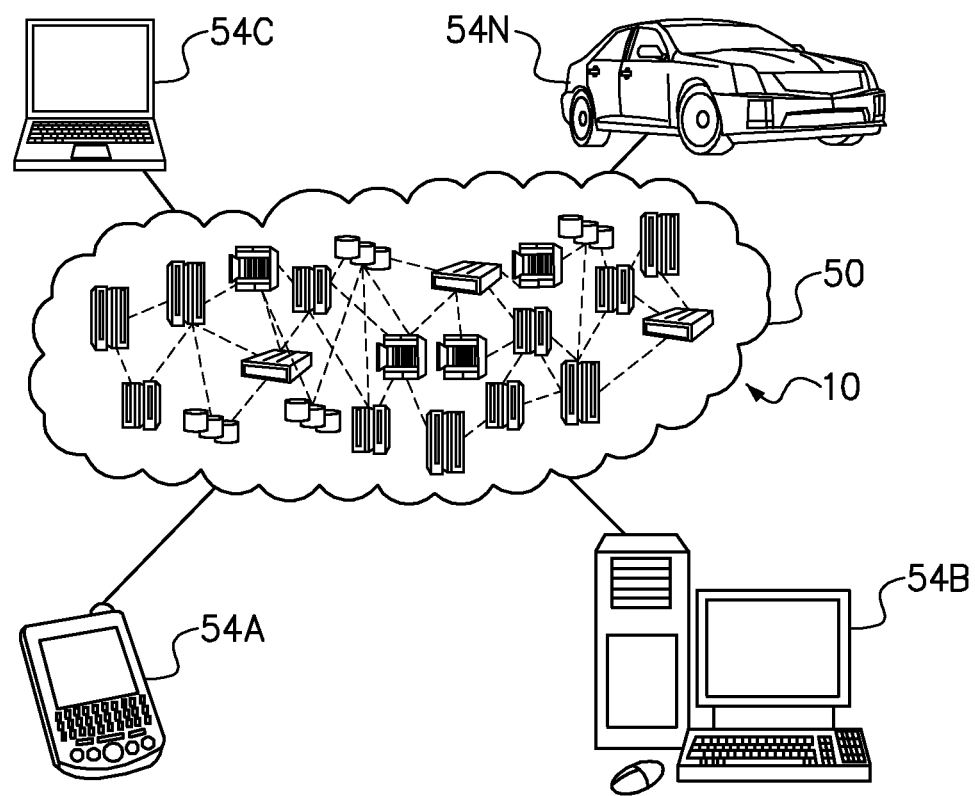
FIG. 2 illustrates an exemplary cloud or cluster configuration of computer program products that may be utilized by the presently disclosed method, system, and/or computer program product.

Referring now to FIG. 2, an illustrative cloud computing environment 50 is depicted. As shown, the cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 2 are intended to be illustrative only and that computing nodes 10 and cloud computing environment 50 can communicate with any type of computerized device over any type of network and/or network addressable connection (e.g., using a web browser).

Figure 3:
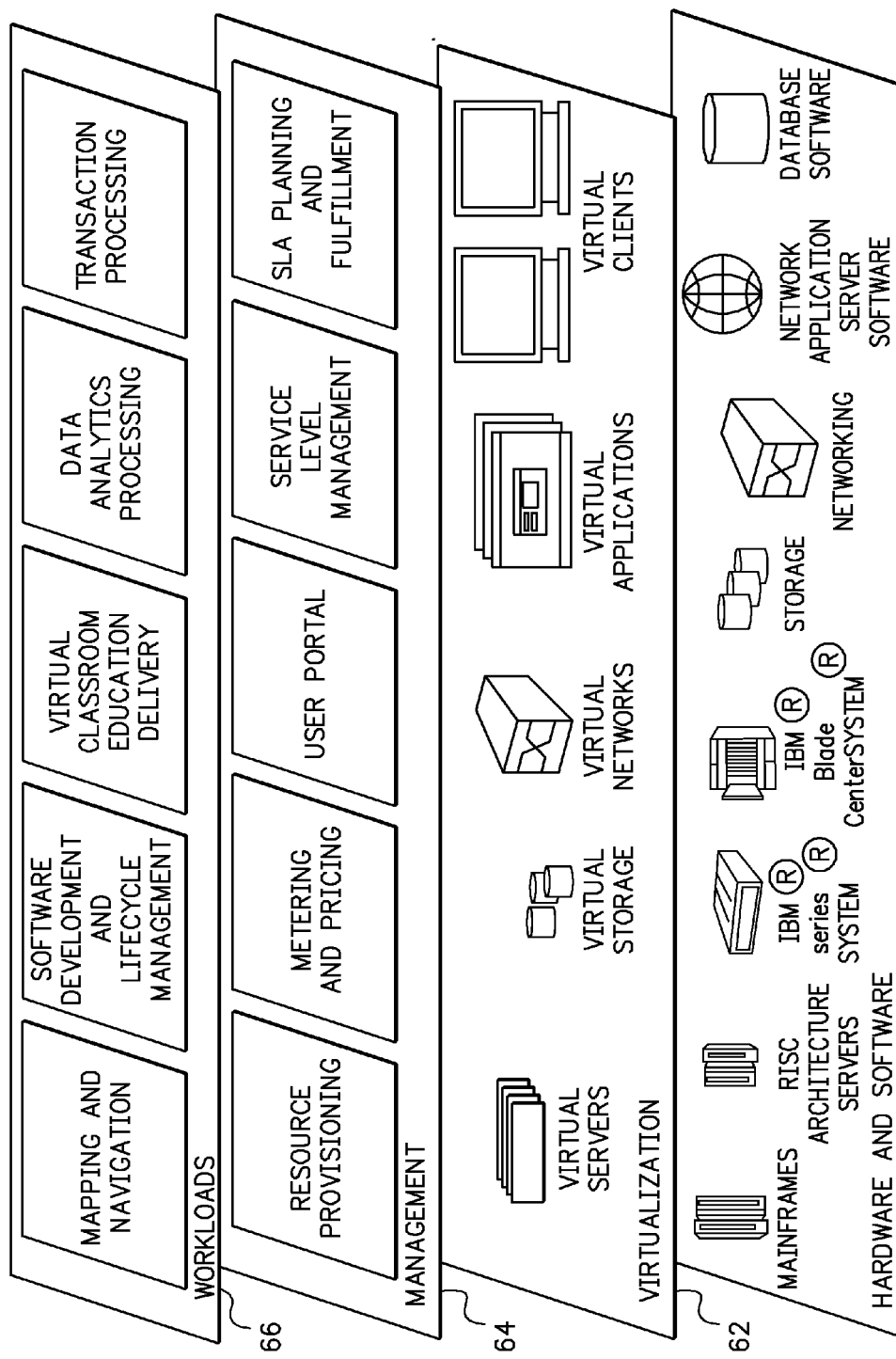
FIG. 3 depicts a physical to application level embodiment of the present invention which contains multiple physical computers in a virtualized rack.

Referring now to FIG. 3, a set of functional abstraction layers provided by cloud computing environment 50 (Shown in FIG. 2) is shown. It should be understood in advance that the components, layers, and functions shown in FIG. 3 are intended to be illustrative only and embodiments of the invention are not limited thereto. As depicted, the following layers and corresponding functions are provided:

Hardware and software layer 60 includes hardware and software components. Examples of hardware components include mainframes, in one example IBM® zSeries® systems; RISC (Reduced Instruction Set Computer) architecture based servers, in one example IBM pSeries® systems; IBM xSeries® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide).

Virtualization layer 62 provides an abstraction layer from which the following examples of virtual entities may be provided: virtual servers; virtual storage; virtual networks, including virtual private networks; virtual applications and operating systems; and virtual clients.

In one example, management layer 64 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provides pre-arrangement for, and procurement of, cloud computing resources for which a future requirement is anticipated in accordance with an SLA.

Workloads layer 66 provides examples of functionality for which the cloud computing environment may be utilized. Examples of workloads and functions which may be provided from this layer include: mapping and navigation; software development and lifecycle management; virtual classroom education delivery; data analytics processing; and transaction processing.

Figure 4:
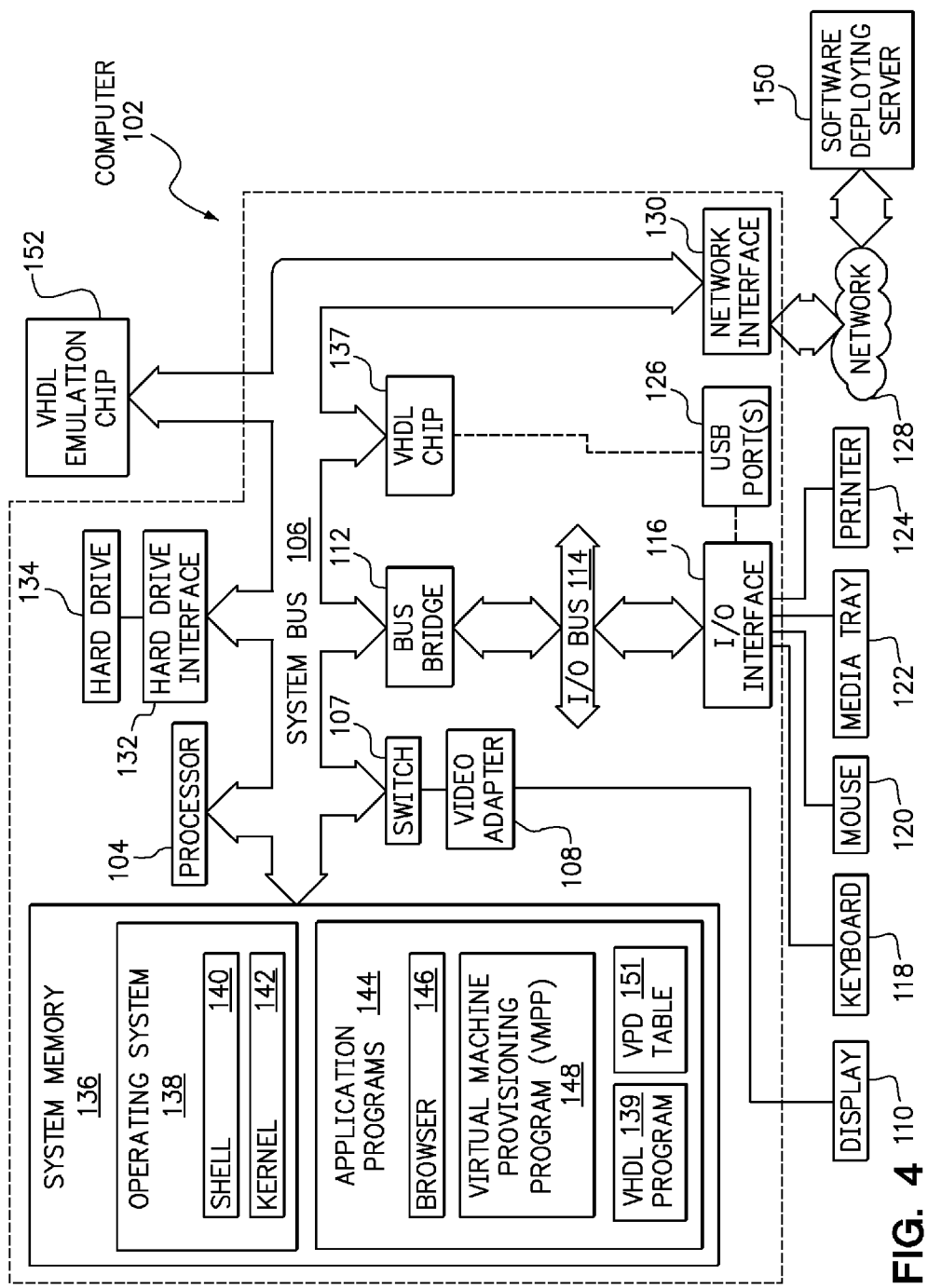
FIG. 4 is an exemplary diagram illustrating the embodiment of the presently disclosed method within a physical computer, system, and/or computer program product.

FIG. 4 depicts an exemplary computing node (or simply "computer") 102 that may be utilized in accordance with one or more embodiments of the present invention. Note that some or all of the exemplary architecture, including both depicted hardware and software, shown for and within computer 102 may be utilized by the software deploying server 150, as well as the provisioning manager/management node 222 and the physical servers 204a-n shown in FIG. 5. Note that while the servers described in the present disclosure are described and depicted in exemplary manner as physically separate servers, they could also be server blades in a blade chassis, and some or all of the computers described herein may be stand-alone computers, servers, or other integrated or stand-alone computing devices. Thus, the terms "blade," "server blade," "computer," and "server" are used interchangeably in the present descriptions.

Computer 102 includes a processor unit 104 that is coupled to a system bus 106. Processor unit 104 may utilize one or more processors, each of which has one or more processor cores. A video adapter 108, which drives/supports a display 110, is also coupled to system bus 106. In one embodiment, a switch 107 couples the video adapter 108 to the system bus 106. Alternatively, the switch 107 may couple the video adapter 108 to the display 110. In either embodiment, the switch 107 is a switch, preferably mechanical, that allows the display 110 to be coupled to the system bus 106, and thus to be functional only upon execution of instructions (e.g., virtual machine provisioning program—VMPP 148 described below) that support the processes described herein.

System bus 106 is coupled via a bus bridge 112 to an input/output (I/O) bus 114. An I/O interface 116 is coupled to I/O bus 114. I/O interface 116 affords communication with various I/O devices, including a keyboard 118, a mouse 120, a media tray 122 (which may include storage devices such as CD-ROM drives, multi-media interfaces, etc.), a printer 124, and (if a VHDL chip 137 is not utilized in a manner described below), external USB port(s) 126. While the format of the ports connected to I/O interface 116 may be any known to those skilled in the art of computer architecture, in a preferred embodiment some or all of these ports are universal serial bus (USB) ports.

As depicted, computer 102 is able to communicate with a software deploying server 150 via network 128 using a network interface 130. Network 128 may be an external network such as the Internet, or an internal network such as an Ethernet or a virtual private network (VPN).

A hard drive interface 132 is also coupled to system bus 106. Hard drive interface 132 interfaces with a hard drive 134. In a preferred embodiment, hard drive 134 populates a system memory 136, which is also coupled to system bus 106. System memory is defined as a lowest level of volatile memory in computer 102. This volatile memory includes additional higher levels of volatile memory (not shown), including, but not limited to, cache memory, registers and buffers. Data that populates system memory 136 includes computer 102's operating system (OS) 138 and application programs 144.

The operating system 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a renderer, shown in exemplary manner as a browser 146. Browser 146 includes program modules and instructions enabling a world wide web (WWW) client (i.e., computer 102) to send and receive network messages to the Internet using hypertext transfer protocol (HTTP) messaging, thus enabling communication with software deploying server 150 and other described computer systems.

Application programs 144 in the system memory of computer 102 (as well as the system memory of the software deploying server 150) also include a virtual machine provisioning program (VMPP) 148. VMPP 148 includes code for implementing the processes of the present invention. In one embodiment, the computer 102 is able to download VMPP 148 from software deploying server 150, including in an on-demand basis. Note further that, in one embodiment of the present invention, software deploying server 150 performs all of the functions associated with the present invention (including execution of VMPP 148), thus freeing computer 102 from having to use its own internal computing resources to execute VMPP 148.

Also stored in the system memory 136 is a VHDL (VHSIC hardware description language) program 139. VHDL is an exemplary design-entry language for field programmable gate arrays (FPGAs), application specific integrated circuits (ASICs), and other similar electronic devices. In one embodiment, execution of instructions from VMPP 148 causes the VHDL program 139 to configure the VHDL chip 137, which may be an FPGA, ASIC, or the like.

In another embodiment of the present invention, execution of instructions from VMPP 148 results in a utilization of VHDL program 139 to program a VHDL emulation chip 152. VHDL emulation chip 152 may incorporate a similar architecture as described above for VHDL chip 137. Once VMPP 148 and VHDL program 139 program VHDL emulation chip 152, VHDL emulation chip 152 performs, as hardware, some or all functions described by one or more executions of some or all of the instructions found in VMPP 148. That is, the VHDL emulation chip 152 is a hardware emulation of some or all of the software instructions found in VMPP 148. In one embodiment, VHDL emulation chip 152 is a programmable read only memory (PROM) that, once burned in accordance with instructions from VMPP 148 and VHDL program 139, is permanently transformed into a new circuitry that performs the functions needed to perform the processes of the present invention.

The hardware elements depicted in computer 102 are not intended to be exhaustive, but rather are representative. For instance, computer 102 may include alternate memory storage devices such as magnetic cassettes, digital versatile disks (DVDs), Bernoulli cartridges, and the like. These and other variations are intended to be within the spirit and scope of the present invention.

A cloud computing environment allows a user workload to be assigned a virtual machine (VM) somewhere in the computing cloud. Each virtual machine provides the software operating system and physical resources such as processing power and memory to support the user's application workload.

Figure 5:
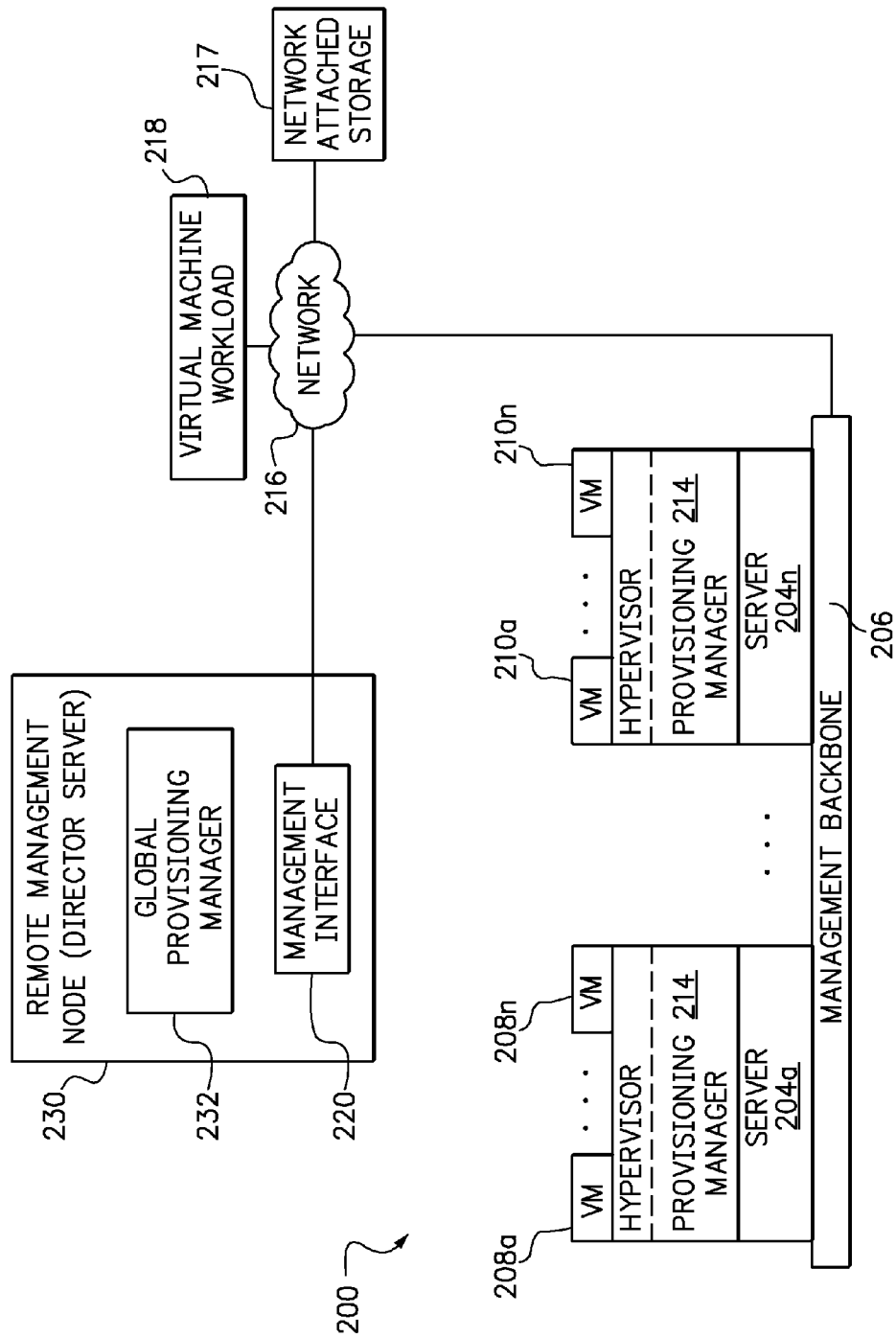
FIG. 5 is a block diagram of virtual machines running on compute nodes controlled by a director server or management node coupled to a provisioning manager utilizing a management backbone to control the compute nodes.

FIG. 5 depicts an exemplary cluster of servers that may be utilized in accordance with one or more embodiments of the present invention. The exemplary cluster 200 may operate in a "cloud" environment to provide a pool of resources. The cluster 200 comprises a plurality of servers 204a-n (where "a-n" indicates an integer number of servers) coupled to a management backbone 206. Each server supports one or more virtual machines (VMs). As known to those skilled in the art of computers, a VM is a software implementation (emulation) of a physical computer. A single hardware computer (blade) can support multiple VMs, each running the same, different, or shared operating systems. In one embodiment, each VM can be specifically tailored and reserved for executing software tasks 1) of a particular type (e.g., database management, graphics, word processing etc.); 2) for a particular user, subscriber, client, group or other entity; 3) at a particular time of day or day of week (e.g., at a permitted time of day or schedule); etc.

As depicted in FIG. 5, a server 204a supports VMs 208a-n (where "a-n" indicates an integer number of VMs), and a server 204n supports VMs 210a-n (wherein "a-n" indicates an integer number of VMs). The servers 204a-n include a hypervisor and provisioning manager 214, guest operating systems, and applications for users (not shown). Provisioning software can be located remotely in the network 216 and transmitted from the network attached storage 217 over the network. The global provisioning manager 232 running on the remote management node (Director Server) 230 performs this task. In this embodiment, the computer hardware characteristics are communicated from the VPD 151 to the VMPP 148. The VMPP 148 communicates the computer physical characteristics to the blade chassis provisioning manager 222, to the management interface 220, and to the global provisioning manager 232 running on the remote management node (Director Server) 230.

Note that the management backbone 206 is also coupled to the network 216, which may be a public network (e.g., the Internet), a private network (e.g., a virtual private network or an actual internal hardware network), etc. The network 216 permits a virtual machine workload 218 to be communicated to a management interface 220 of the remote management node 230. This virtual machine workload 218 is a software task whose execution, on any of the VMs within one of the servers 204, is to request and coordinate deployment of workload resources with the management interface 220. The management interface 220 then transmits this workload request to a hypervisor and provisioning manager 214, which is hardware and/or software logic capable of configuring VMs within the an individual server 204 to execute the requested software task. In essence the virtual machine workload 218 manages the overall provisioning of VMs by communicating with the management backbone 206 connected to each of the individual servers 204 a-n, provisioning each VM 208a-n and 210a-n using the servers internal provisioning manager 214 integrated with the hypervisor. Note that the server 204 is an exemplary computer environment in which the presently disclosed methods can operate. The scope of the presently disclosed system is not limited to a physical server or to a blade chassis, however. That is, the presently disclosed methods can also be used in any computer environment that utilizes some type of workload management or resource provisioning, as described herein. Thus the terms "server", "blade chassis", "computer chassis", and "computer environment" are used interchangeably to describe a computer system that manages multiple servers/blades/computers.

Figure 6A:
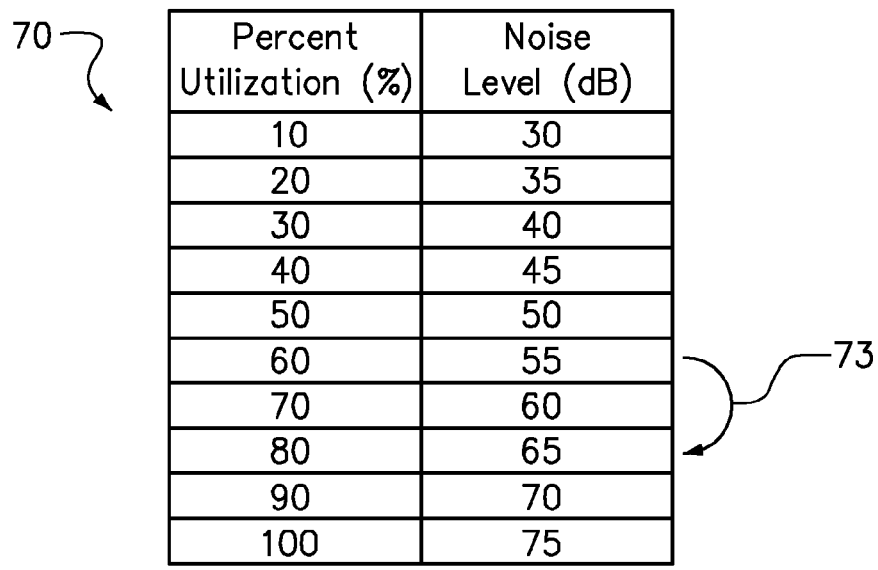
FIGS. 6A-6B are tables representing hypothetical utilization/noise correlations for two different types of compute nodes.
Figure 6B:
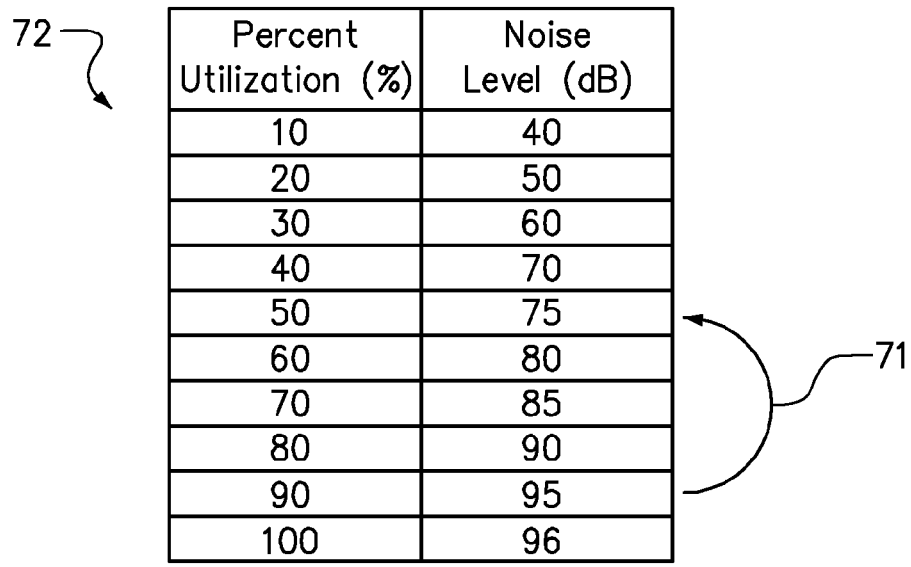

FIGS. 6A-6B are tables representing hypothetical utilization/noise correlations for two different types of compute nodes. In FIG. 6A, the table 70 provides a hypothetical utilization/noise correlation for a server x3850. In this correlation, the noise level (dB) in the right-hand column is measured at every 10% increment of utilization. In FIG. 6B, the table 72 provides a hypothetical utilization/noise correlation for a BladeCenter blade server. In this correlation, the noise level (dB) in the right-hand column is measured at every 10% increment of utilization. Note that the two different types of servers produce different levels of noise across the range of utilization. These two tables 70, 72 will be referenced again in the discussion of FIG. 7, below.

Figure 7:
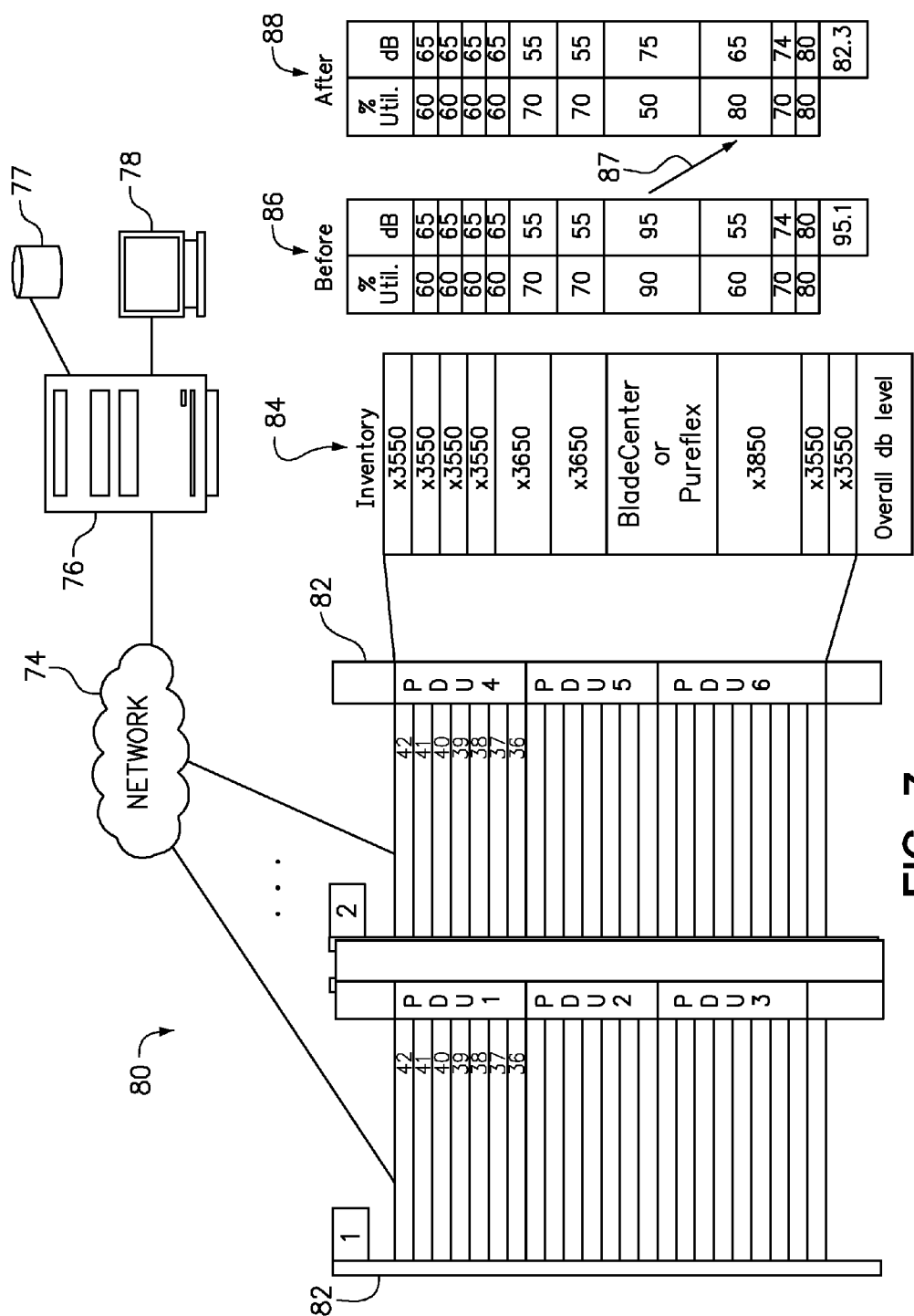
FIG. 7 is a diagram of a cluster illustrating workload distribution to reduce the overall noise produced by the cluster.

FIG. 7 is a diagram of a cluster 80 illustrating workload distribution to reduce the overall noise produced by the cluster. The cluster 80 is not limited in its configuration, but is illustrated with various compute nodes included in two racks 82, which may include power distribution units (PDUs), network switches, storage devices, and other supporting devices. One of the racks has been expanded to show the server implementation in the rack. For purposes of a limited illustration of one embodiment of the present invention, the servers in this rack (right-hand rack 82) are considered to be representative of the cluster 80 and a method of distributing workload to reduce noise will be applied to these servers.

A local or remote management entity 76, including optional data storage 77 and a user interface 78, communicates with the servers in the cluster over a network 74, such as a local area network. Accordingly, the management entity 76 obtains the inventory 84, which identifies the servers within the cluster. The illustrated inventory includes six x3550 servers, two x3650 servers, one x3850 server, and a BladeCenter blade server chassis or Pureflex system chassis. In accordance with the present invention, the management entity 76 should already have access to utilization/noise calibrations for each of these compute node (server) types, such as those illustrated in FIGS. 6A-6B.

Applications or jobs running on the servers identified in the inventory 84 represent workload that results in the generation of noise. The example in FIG. 7 shows the percent utilization and resulting noise for a random distribution of jobs (see table 86; "Before"), as well as the percent utilization and resulting noise for a distribution of jobs after a large job has been migrated (as illustrated by the arrow 87) from the BladeCenter to the x3850 server (see table 88; "After").

Although not shown, the inventory 84 identifies the capacity of each server. If the management entity also obtains a measure of the workload associated with the job to be migrated, then it is possible to calculate a percent utilization that is attributable to that job. Since each of the different types of servers within the cluster may have different capacities, running the job on one server or another server may result in different percent utilizations. As illustrated here, migrating the job from a BladeCenter to an x3850 server cause a 40% reduction in the percent utilization of the BladeCenter, while only increasing the percent utilization of the x3850 by 20%.

Migrating the job away from the BladeCenter reduces the percent utilization of the BladeCenter from 90% before migration to 50% after migration. Referring to the utilization/noise calibration 72 for a BladeCenter in FIG. 6B, reducing the percent utilization from 90% to 50% is known to result in a noise reduction from 95 dB to 75 dB (as illustrated by the arrow 71). Similarly referring to the utilization/noise calibration 70 for an x3850 server in FIG. 6A, increasing the percent utilization from 60% to 80% is known to result in a noise increase from 55 dB to 65 dB (as illustrated by the arrow 73). The overall noise level generated by all of the compute nodes in the cluster (inventory 84) as shown in table 86 before migration is calculated to be 95.1 dB. By contrast, the overall noise level generated by all of the compute nodes in the cluster (inventory 84) as shown in table 87 after migration is calculated to be 82.3 dB. The result of distributing workload in accordance with the present invention is a noise reduction of about 13 dB in in the same cluster environment executing the same jobs.

Figure 8:
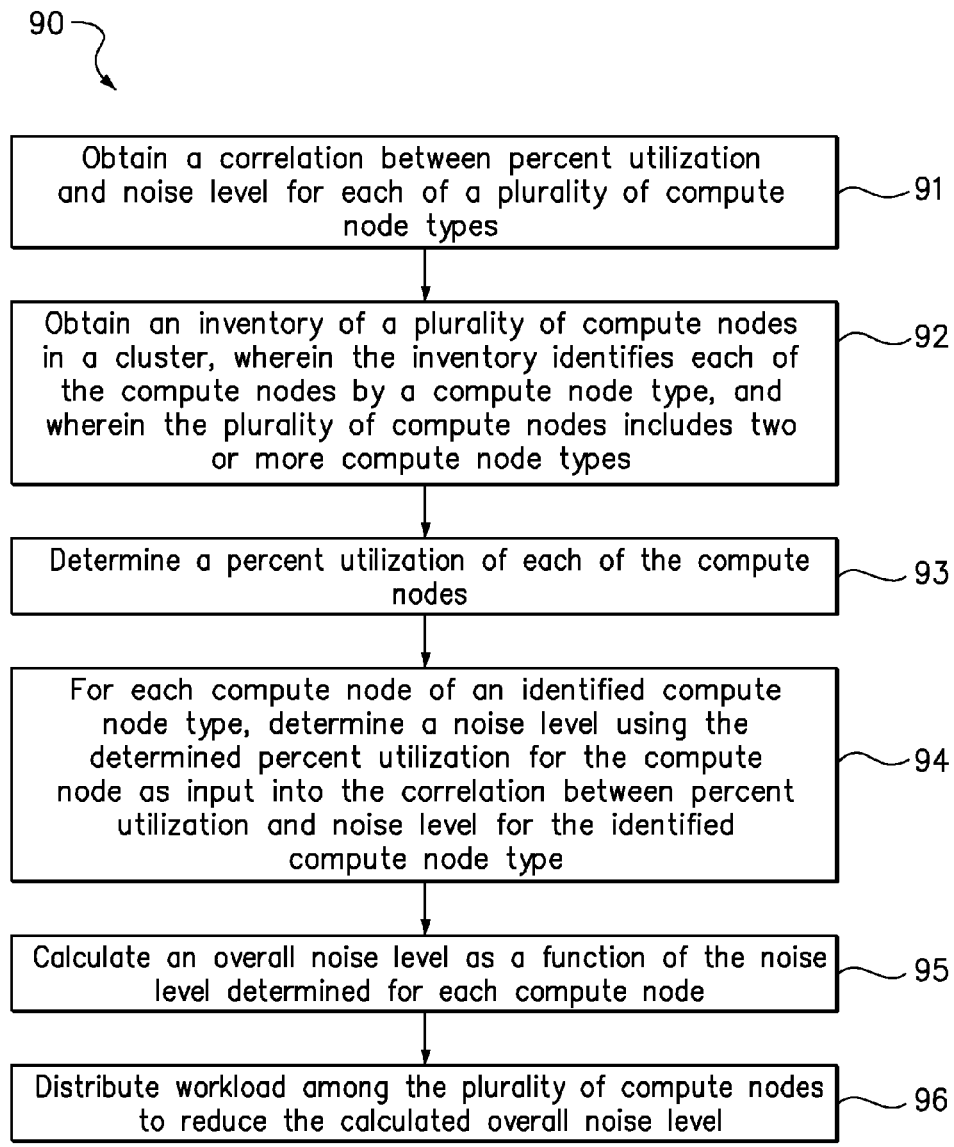
FIG. 8 is a flowchart of a method of reducing noise produced by a plurality of compute nodes in a cluster.

FIG. 8 is a flowchart of a method 90 of reducing noise produced by a plurality of compute nodes in a cluster. In step 91, the method obtains a correlation between percent utilization and noise level for each of a plurality of compute node types (see tables 70, 72 FIGS. 6A-6B). In step 92, the method obtains an inventory of a plurality of compute nodes in a cluster, wherein the inventory identifies each of the compute nodes by a compute node type, and wherein the plurality of compute nodes includes two or more compute node types (see inventory 84 in FIG. 7). A percent utilization of each of the compute nodes is determined in step 93, before determining a noise level, for each compute node of an identified compute node type, using the determined percent utilization for the compute node as input into the correlation between percent utilization and noise level for the identified compute node type, in step 94. Step 95 calculates an overall noise level as a function of the noise level determined for each compute node, and step 96 distributes workload among the plurality of compute nodes to reduce the calculated overall noise level.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in one or more computer-readable storage medium having computer-usable program code stored thereon.

Any combination of one or more computer usable or computer readable storage medium(s) may be utilized. The computer-usable or computer-readable storage medium may be, for example but not limited to, an electronic, magnetic, electromagnetic, or semiconductor apparatus or device. More specific examples (a non-exhaustive list) of the computer-readable medium include: a portable computer diskette, a hard disk, random access memory (RAM), read-only memory (ROM), an erasable programmable read-only memory (EPROM or Flash memory), a portable compact disc read-only memory (CD-ROM), an optical storage device, or a magnetic storage device. The computer-usable or computer-readable storage medium could even be paper or another suitable medium upon which the program is printed, as the program can be electronically captured via, for instance, optical scanning of the paper or other medium, then compiled, interpreted, or otherwise processed in a suitable manner, if necessary, and then stored in a computer memory. In the context of this document, a computer-usable or computer-readable storage medium may be any storage medium that can contain or store the program for use by a computer. Computer usable program code contained on the computer-usable storage medium may be communicated by a propagated data signal, either in baseband or as part of a carrier wave. The computer usable program code may be transmitted from one storage medium to another storage medium using any appropriate transmission medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A computer-implemented method comprising:
   obtaining a correlation between percent utilization and noise level for each of a plurality of compute node types;
   obtaining an inventory of a plurality of compute nodes in a cluster, wherein the inventory identifies each of the compute nodes by a compute node type, and wherein the plurality of compute nodes includes two or more compute node types;
   determining a percent utilization of each of the compute nodes;
   for each compute node of an identified compute node type, determining a noise level using the determined percent utilization for the compute node as input into the correlation between percent utilization and noise level for the identified compute node type;
   calculating an overall noise level of the cluster as a function of the noise level determined for each compute node; and
   distributing workload among the plurality of compute nodes to reduce the calculated overall noise level.

2. The method of claim 1, wherein each compute node is selected from a server and a network switch.

3. The method of claim 1, wherein obtaining a correlation between percent utilization and noise level for each of a plurality of compute node types, includes accessing empirical data storing a noise level measured at various percent utilization of a compute node of each compute node type.

4. The method of claim 3, wherein the empirical data storing a noise level measured at various percent utilization of a compute node is collected by using an acoustic sensor to measure the noise level as the percent utilization of a compute node is varied in an acoustically isolated test environment.

5. The method of claim 3, wherein the empirical data storing a noise level measured at various percent utilization of a compute node is obtained by a compute node within the cluster using an acoustic sensor to measure the noise level as the percent utilization is varied.

6. The method of claim 1, wherein the plurality of compute node types includes a first compute node type having a processor, a hard drive, and a power supply, and wherein the correlation between percent utilization and noise level for the first compute node type includes a correlation between noise level and a percent utilization of the processor, a percent utilization of the hard drive, and a percent utilization of the power supply.

7. The method of claim 1, wherein the noise from each compute node is non-coherent.

8. The method of claim 7, wherein the overall noise level is calculated equal to:

$$10 \cdot \log_{10}\left(\frac{p_1^2 + p_2^2 + \ldots + p_n^2}{p_0^2}\right)$$

wherein: n is the number of compute nodes in the cluster;
   $p_i$ is the noise level produced by compute node i, where i is an integer number from 1 to n; and
   $p_0$ is the sound pressure of 20 microPascals (μPa).

9. The method of claim 1, wherein distributing workload among the plurality of compute nodes to reduce the calculated overall noise level, includes distributing workload among the plurality of compute nodes to minimize the calculated overall noise level in the cluster.

10. The method of claim 1, wherein distributing workload among the plurality of compute nodes to reduce the calculated overall noise level, includes migrating a job from a first compute node in the cluster to a second compute node in the cluster in response to determining that migrating the job from the first compute node to the second compute node will reduce the noise produced by the first compute node more than increase the noise produced by the second compute node.

11. The method of claim 1, wherein distributing workload among the plurality of compute nodes to reduce the calculated overall noise level, includes migrating a job from a first compute node in the cluster to a second compute node in the cluster in response to determining that migrating the job from the first compute node to the second computer node will reduce the overall noise level more than migrating another job between any other combination of compute nodes.

12. The method of claim 1, wherein a management entity obtains the inventory of the plurality of compute nodes in the cluster, and wherein a workload manager running on the management entity distributes workload among the plurality of compute nodes to reduce the calculated overall noise level in the cluster.

13. The method of claim 1, wherein distributing workload among the plurality of compute nodes to reduce the calculated overall noise level, includes provisioning a new job to a target compute node in the cluster, wherein the target compute node is selected from among the plurality of compute nodes in the cluster as being able to run the new job with a smaller increase in the overall noise level than any of the other compute nodes in the cluster.

14. The method of claim 1, wherein distributing workload among the plurality of compute nodes to reduce the calculated overall noise level, includes
    booting an additional compute node in the cluster and migrating a job from a first compute node in the cluster to the additional compute node in response to determining that booting the additional compute node and migrating the job from the first compute node to the additional compute node will reduce the overall noise level.

15. The method of claim 1, further comprising:
    obtaining a correlation between percent utilization and noise level for each of a plurality of supporting device types;
    obtaining an inventory of supporting devices in the cluster, wherein the inventory identifies each of the supporting devices by a supporting device type;
    determining a percent utilization of each of the supporting devices;
    for each supporting device of an identified supporting device type, determining a noise level using the determined percent utilization for the supporting device as input into the correlation between percent utilization and noise level for the identified supporting device type;
    wherein calculating an overall noise level as a function of the noise level determined for each compute node includes calculating an overall noise level as a function of the noise level determined for each compute node and the noise level determined for each supporting device.

16. The method of claim 15, wherein the supporting devices are selected from network switches and storage devices.

17. The method of claim 15, wherein distributing workload among the plurality of compute nodes to reduce the calculated overall noise level, includes migrating a job from a first compute node in the cluster to a second compute node in the cluster in response to determining that migrating the job from the first compute node to the second compute node will reduce the noise produced by the first compute node and the supporting devices used by the first compute node more than increase the noise produced by the second compute node and the supporting devices used by the second compute node.

18. A computer program product including computer usable program code embodied on a non-transitory computer readable storage medium, wherein the computer usable program code is executable by a hardware processor, the computer program product including:
    computer usable program code for obtaining a correlation between percent utilization and noise level for each of a plurality of compute node types;
    computer usable program code for obtaining an inventory of a plurality of compute nodes in a cluster, wherein the inventory identifies each of the compute nodes by a compute node type, and wherein the plurality of compute nodes includes two or more compute node types;
    computer usable program code for determining a percent utilization of each of the compute nodes;
    computer usable program code for determining, for each compute node of an identified compute node type, a noise level using the determined percent utilization for the compute node as input into the correlation between percent utilization and noise level for the identified compute node type;
    computer usable program code for calculating an overall noise level in the cluster as a function of the noise level determined for each compute node; and
    computer usable program code for distributing workload among the plurality of compute nodes to reduce the calculated overall noise level in the cluster.

19. The computer program product of claim 18, wherein the computer usable program code for distributing workload among the plurality of compute nodes to reduce the calculated overall noise level, includes computer usable program code for distributing workload among the plurality of compute nodes to minimize the calculated overall noise level in the cluster.

20. The computer program product of claim 18, wherein the computer usable program code for distributing workload among the plurality of compute nodes to reduce the calculated overall noise level, includes computer usable program code for migrating a job from a first compute node in the cluster to a second compute node in the cluster in response to determining that migrating the job from the first compute node to the second compute node will reduce the noise produced by the first compute node more than increase the noise produced by the second compute node.

* * * * *